United States Patent [19]

Pezzani

[11] Patent Number: 5,608,235
[45] Date of Patent: Mar. 4, 1997

[54] VOLTAGE-CONTROLLED BIDIRECTIONAL SWITCH

[75] Inventor: Robert Pezzani, Vouvray, France

[73] Assignee: SGS-Thomson Microelectronics S.A., Saint Genis Pouilly, France

[21] Appl. No.: 335,442

[22] Filed: Nov. 7, 1994

[30] Foreign Application Priority Data

Nov. 10, 1993 [FR] France ................................. 93 13676

[51] Int. Cl.⁶ .................................................. H01L 29/74
[52] U.S. Cl. ........................ 257/119; 257/122; 257/124; 257/135; 257/140; 257/141; 257/161; 257/162; 257/167
[58] Field of Search .................................. 257/119, 121, 257/122, 124, 127, 133, 135, 141, 162, 167, 175, 123, 132, 140, 143, 146, 157, 161

[56] References Cited

U.S. PATENT DOCUMENTS

| | | | |
|---|---|---|---|
| 4,464,673 | 8/1984 | Patalong | 357/38 |
| 4,547,791 | 10/1985 | Roger et al. | 357/43 |
| 4,737,834 | 4/1988 | Spenke | 357/38 |
| 4,794,441 | 12/1988 | Sugawara et al. | 257/146 |

FOREIGN PATENT DOCUMENTS

| | | | |
|---|---|---|---|
| 0039941 | 11/1981 | European Pat. Off. | H01L 29/74 |
| 0064715 | 11/1982 | European Pat. Off. | H01L 29/74 |
| 0064716 | 11/1982 | European Pat. Off. | H01L 29/74 |
| 2097585 | 11/1982 | United Kingdom | H01L 27/06 |

OTHER PUBLICATIONS

Patent Abstracts of Japan, vol. 13, No. 51 (E–712) 6 Feb. 1989 & JP–A–63 244 881 Toshiba Corp and others, Oct. 12, 1988.

Patent Abstracts of Japan, vol. 6, No. 147 (E–123) (1025) Aug. 6, 1982 & JP–A–57 071 178 (Nippon Denki K.K.) May 1, 1982.

*Primary Examiner*—Minhloan Tran
*Attorney, Agent, or Firm*—David M. Driscoll; James H. Morris

[57] ABSTRACT

A voltage-controlled power monolithic bidirectional switch has two main terminals and includes a control electrode whose voltage is referenced to one of the main terminals. The switch includes a lateral P-channel MOS transistor; a vertical N-channel MOS transistor, the source well of the vertical N-channel MOS transistor also constituting the source of the lateral transistor; a lateral thyristor whose first three regions correspond to the source, drain and channel of the lateral MOS transistor; a first vertical thyristor disposed in parallel with the lateral thyristor; and a second vertical thyristor having a polarity opposite to the first polarity and disposed in parallel with the vertical MOS transistor.

20 Claims, 3 Drawing Sheets

VOLTAGE-CONTROLLED BIDIRECTIONAL SWITCH

BACKGROUND OF THE INVENTION

1. Field of the Invention

The present invention relates to a semiconductor component forming a controlled bidirectional switch. More particularly, the present invention provides such a switch capable of withstanding a high current in order, for example, to directly control a load connected to the mains.

2. Discussion of the Related Art

The most commonly known bidirectional switches that are used to control the switching of a.c. currents are triacs which correspond to a parallel, head-to-tail, connection of two thyristors. Triacs, like thyristors, are current controlled. The control currents needed to ensure the triggering of conduction are high, and are substantially higher for triacs than for thyristors. Typical values are several tens of mA. Such high values do not typically allow triacs to be directly controlled by MOS logic circuits.

Moreover, conventional power components provided with control means through MOS-type interfaces, that is, voltage controlled components, are mainly MOS transistors, IGBT, MCT, or analog. The last two components are combinations of control MOS components with bipolar components (bipolar transistors for the IGBTs and thyristors for the MCTs) for the power function.

The above components have drawbacks in that they are unidirectional, which involves the use of a rectifying bridge for operation with a.c. supplies; and their cost per ampere ratio is high, particularly because the surface occupied by MOS-type elements is large with respect to the whole surface of the component.

SUMMARY OF THE INVENTION

An object of the present invention is to provide a component that, like a triac, directly switches a.c. currents provided by a supply source such as the mains, and that can be voltage-controlled at the triggering, the control terminal being fed with reference to a given one of the main terminals of the component.

A further object of the present invention is to provide such a component having a low cost per ampere ratio, because, particularly, the surface occupied by the MOS elements is reduced and further because these MOS elements have a simple structure.

To achieve these objects, the present invention provides a monolithic voltage-controlled bidirectional switch having two main terminals and a control electrode whose voltage is referenced with respect to one of the main terminals. The switch includes a lateral P-channel MOS transistor and a vertical N-channel MOS transistor. The source well of the vertical N-channel MOS transistor also constitutes the source of the lateral P-channel MOS transistor. The N and P conductivity types can be inverted.

According to an aspect of the present invention, the voltage-controlled switch includes, in a semiconductor substrate of a first conductivity type, at least a first and at least a second well of the second conductivity type; a first region of the first conductivity type formed in each second well and extending along a portion of the periphery of the second well to define a first channel; a first main terminal connected to a metallization that is formed over the second wells and the first regions; a second main terminal connected to a metallization that is formed over the first wells; and a control terminal connected to a first insulated gate, formed over the first channel, connected to a second insulated gate, formed over a second channel corresponding to a portion of the gap between each first and second well.

The present invention also provides a voltage-controlled power monolithic bidirectional switch that has two main terminals and that is controlled by a control electrode whose voltage is referenced with respect to one of the main terminals. The voltage-controlled switch includes a lateral P-channel MOS transistor; a vertical N-channel MOS transistor, the source well of the vertical N-channel MOS transistor also constituting the source of the P-channel MOS transistor; a lateral thyristor whose three first regions correspond to the source, to the drain and to the channel of the lateral MOS transistor; a first vertical thyristor disposed in parallel with the lateral thyristor; and a second vertical thyristor whose polarity is opposite to the polarity of the first vertical thyristor and which is connected in parallel with the vertical MOS transistor.

According to an aspect of the invention, the power switch includes a substrate of the first conductivity type; at least a first and a second well, of the second conductivity type, formed in the upper surface of the substrate; at least a first region having a small surface of the first conductivity type, formed in each second well, and extending along a portion of the periphery of the second well to define a first channel; a second region of the first conductivity type extending in each second well and occupying substantially one half of the surface of the second well; a layer of the second conductivity type formed near the lower surface of the substrate; a third region of the first conductivity type, formed in the layer of the second conductivity type facing the areas of one or more second wells, so as to complement the second regions; a deep diffused region of the second conductivity type connecting the second well on the upper surface to the layer formed near the lower surface of the substrate; a fourth region of the first conductivity type, formed in the first well; a first metallization connecting the first region to the second well; a second metallization connecting the fourth region to the deep diffused region; a first main terminal connected to a third metallization formed over the second wells and second regions; a second main terminal connected to a fourth metallization on the lower surface; and a control terminal connected to a first insulated gate, formed over a second channel, and to a second insulated gate, formed over a second channel corresponding to a portion of the gap between each first and second well.

The foregoing and other objects, features, aspects and advantages of the invention will become apparent from the following detailed description of the present invention when taken in conjunction with the accompanying drawings.

As conventional in integrated circuit representation, the various drawings representing cross-sectional views of semiconductor components are not drawn to scale, the transverse or longitudinal sizes of the various layers are arbitrarily enlarged or contracted to simplify the drawings.

DETAILED DESCRIPTION

Figure 1:
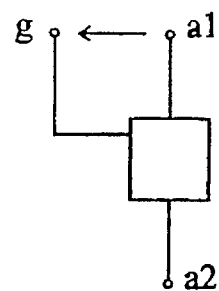
FIG. 1 is a block diagram of a component that the present invention aims to realize.

FIG. 1 schematically represents a component that the invention aims to realize. This component constitutes a switch including two main terminals a1 and a2 and a control terminal g. Terminals a1 and a2 are designed to be connected to an a.c. supply source through a load. In the following description, it is assumed that terminal a1 is a reference terminal, for example ground, and that the voltage on terminal a2 alternatively has positive and negative values with respect to the reference voltage on terminal a1.

In the embodiment described below, the switching on signal applied on terminal g must be positive with respect to the voltage of terminal a1 when terminal a2 is positive with respect to terminal a1, and must be negative with respect to the voltage of terminal a1 when the terminal a2 is negative with respect to terminal a1.

According to a first aspect of the present invention, a component, such as the one illustrated in FIG. 1, can conduct only low power, that is, a low current, between terminals a1 and a2. Such a component can be used to switch high currents when it is associated with thyristors or a triac as illustrated in FIGS. 2 or 3.

Figure 2:
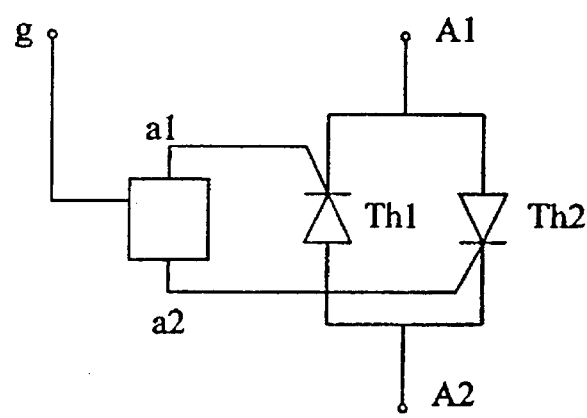
FIGS. 2 and 3 illustrate possible uses of the component of FIG. 1.

In FIG. 2, two thyristors Th1 and Th2 are head-to-tail connected between terminals A1 and A2. The thyristor gates are respectively connected to terminals a1 and a2 of the component according to the invention. In this case, if terminal g of the component according to the invention is positively biased with respect to terminal A1, while terminal A1 is positive with respect to terminal a2, the thyristor Th2 will turn on, and if the terminal g is negatively biased with respect to terminal A1, while terminal A1 is negative with respect to the terminal A2, the thyristor Th1 will turn on.

Figure 3:
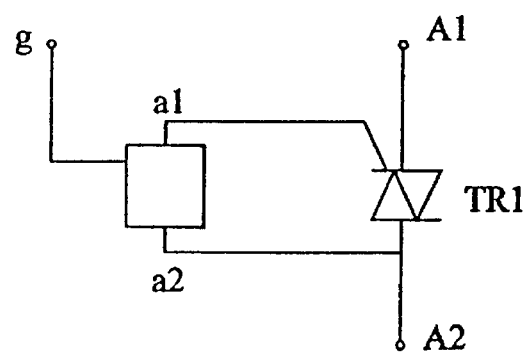

FIG. 3 represents a similar circuit in which thyristors Th1 and Th2 are replaced with a triac TR1 whose gate is connected to the terminal a1 and whose main terminal A2, opposite to the terminal corresponding to the gate, is connected to terminal a2.

Other applications of the component according to the invention will be apparent to those skilled in the art. In the two above described applications, the component according to the invention is capable of withstanding the whole voltage applied to the terminals of the main power component, that is, for example, the mains voltage, the commercial supply voltage such as 110 volts AC/60 Hz in the United States or 220 volts AC/50 Hz in Europe) but, in contrast, the component must conduct a low current only (the gate current of a thyristor or triac).

Figure 4A:
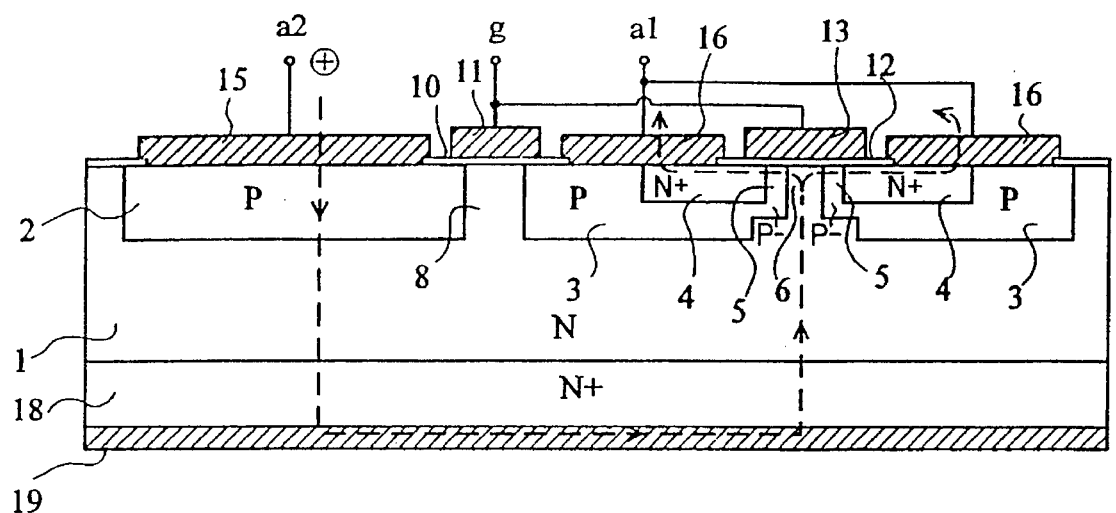
FIGS. 4A and 4B are cross-sectional views of an embodiment of a component according to the present invention along with two respective polarization modes.

FIG. 4A is a cross-sectional schematic view of an embodiment of a component according to the invention. This component is fabricated from a semiconductor substrate 1 of a first conductivity type. In the following description, it will be assumed that the first conductivity type is N and the second conductivity type is P, but of course, these conductivity types can be inverted, the polarizations being correspondingly inverted. A first P-type well 2 and a second P-type well 3 are formed in the upper surface of the substrate. A highly doped (N$^+$) N-type region 4 is formed in the second well 3. Region 4 extends along at least one edge of the P-type well to define a channel region 5 with the edges of the P-type well. Preferably, the P-type well area corresponding to the channel region 5 is a P-type region previously formed and having a lower doping level (P$^-$). Regions 3, 4, 5 correspond to a conventional cell of a vertical power MOS transistor. Conventionally, as viewed from above, the square or round shaped region 4 surrounds region 5, that in turn surrounds an apparent portion 6 of substrate 1. In addition, the component illustrated in FIG. 4A can be multicellular, that is, it can include, inside well 3, a plurality of annular N$^+$-type regions 4 and associated regions 5. Similarly, a P-type well, similar to well 2, can be symmetrically disposed with respect to well 2 on the other side of well 3.

The P-type wells 2 and 3 have facing edges which extend parallel at a constant distance. The portion 8 of the N-type substrate extending between these edges is coated with a thin insulating layer 10 in turn coated with a conductive gate 11. Similarly, the channel region 5 is coated with a thin insulating layer 12, in turn coated with a conductive gate 13. The upper surface of well 2 is coated with a metallization 15, and the upper surface of well 3 and region 4, except the channel region 5, is coated with a metallization The insulating layers 10 and 12 are conventionally made of silicon oxide. All the conductive layers 11, 13, 15, 16 can be formed by metallization, although any other conductive material such as, for example, polycrystalline silicon, metal silicide, polycrystalline silicon coated with metal silicide, conductive alloys, or composite conductive layers, can also be used to form one or several of these layers.

Preferably, the rear surface of substrate 1 includes a highly doped (N$^+$) layer 18 having the same conductivity type as the substrate 1. More preferably, the rear surface of layer 18 is coated with a floating metallization 19.

Metallization 16 forms the component terminal a1; metallization 15 forms the component terminal a2; the interconnected metallizations 11 and 13 form the gate terminal g of the component.

Figure 4B:
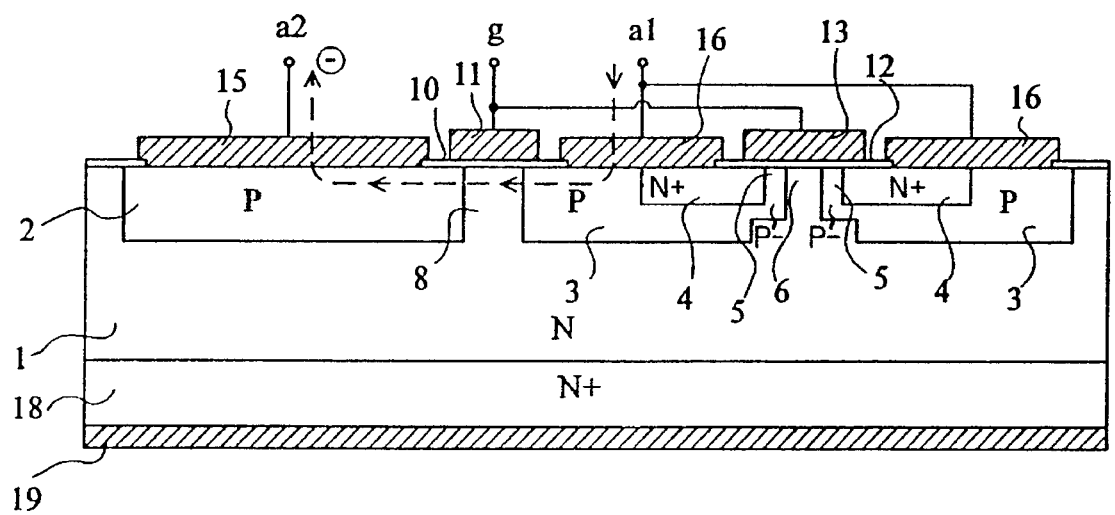
Figure 4C:
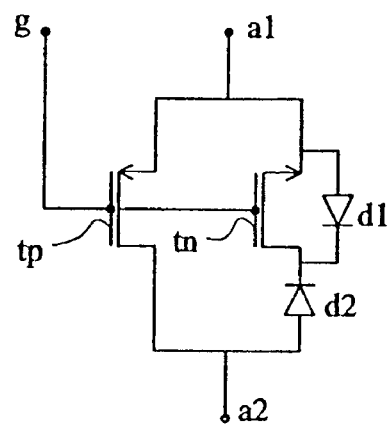
FIG. 4C represents an equivalent diagram of the component of FIGS. 4A and 4B.

An equivalent circuit of the component of FIG. 4A is illustrated in FIG. 4C. The component includes two MOS transistors. The first MOS transistor is an N-channel transistor tn whose source is formed by the N$^+$ region 4, whose gate is constituted by metallization 13 and whose drain corresponds to substrate 1. The second MOS transistor is a P-channel transistor tp, whose gate, source and drain respectively correspond to metallization 11 and to wells 3 and 2. This P-channel MOS transistor tp is symmetrical, that is, it can symmetrically block a voltage in both directions. The junction between well 3 and substrate 1 corresponds to a diode d1 in antiparallel, head-to-tail connected, on transistor tn, and the junction between well 2 and substrate 1 corresponds to a diode d2, in series with transistor tn, and whose anode is connected to terminal a2. These junctions can withstand high voltages since the substrate 1 has a high resistivity. Moreover, the P-channel MOS transistor, that is sensitive since the substrate has a low doping level, can have a relatively important gate oxide thickness to improve the breakdown voltage. This thickness can be, for example, 1–2 μm, and the length of the channel can be approximately 200–300 μm. In contrast, to be more sensitive, the N-channel MOS transistor, that has a channel 5 which is unavoidably more highly doped than substrate 1, must have a thinner insulating gate, for example, approximately 0.1–0.3 μm, and a shorter channel length, for example 5–50 μm. However, these small sizes are unimportant for the breakdown voltage which is ensured by the specific disposition of the transistor cells, as is well known in the field of vertical MOS transistors.

The operation of the component according to the invention will now be explained when an a.c. voltage is applied between terminals a1 and a2. In all cases, it is assumed that terminal a1 is connected to a reference voltage, for example ground.

FIG. 4A illustrates the case when the terminal a2 is positive with respect to terminal a1, for example, is connected to a voltage of approximately 100 volts. Then, the PN junction between well 2 and substrate 1 (diode d2) is conductive and the current flowing toward terminal is blocked by the N-channel MOS transistor (tn). If a positive voltage is applied to terminal g, the action of gate 13 generates a channel in region 5 and current flows along the path drawn in dotted lines, from terminal a2, to substrate 1, layer 18, metallization 19, layer 18, substrate 1, in the channel area 5; then, to region 4 and terminal a1. This positive control voltage on terminal g enhances the blocking state of the P-channel transistor; accordingly, no current flows beneath gate 11 in channel 8.

FIG. 4B illustrates the case when terminal a2 is negative with respect to terminal a1. Then, the application of a negative control voltage at terminal g renders the P-channel MOS transistor conductive; then, current flows from terminal a1 to terminal a2 along the path drawn in dotted lines. This negative voltage on terminal g enhances the blocking state of the N-channel transistor.

Thus, the component according to the present invention constitutes a voltage-controlled device that can receive an a.c. voltage between its main terminals, the control terminal g being constantly referenced with respect to the same main terminal (a1). Thus, an object of the present invention is attained. However, in this component, the current paths includes passageways through channels of the MOS transistor. Accordingly, unless large-size components are provided, it is difficult to obtain very low values for the conduction resistors; so, the device will not be as suitable for directly switching a high power load connected to the mains terminals.

For this reason, as explained above with reference to FIGS. 2 and 3, the component of FIGS. 4A and 4B is used as a control device for a triac or for a set of thyristors, the component according to the invention having merely to block or to conduct gate currents of thyristors or triacs.

According to another aspect of the present invention, a component such as the one of FIG. 4 is integrated in a monolithic structure in which thyristors relay the MOS transistors after turn on. This component can conduct higher currents and therefore can directly switch the voltage of the mains on a high power load.

Figure 5A:
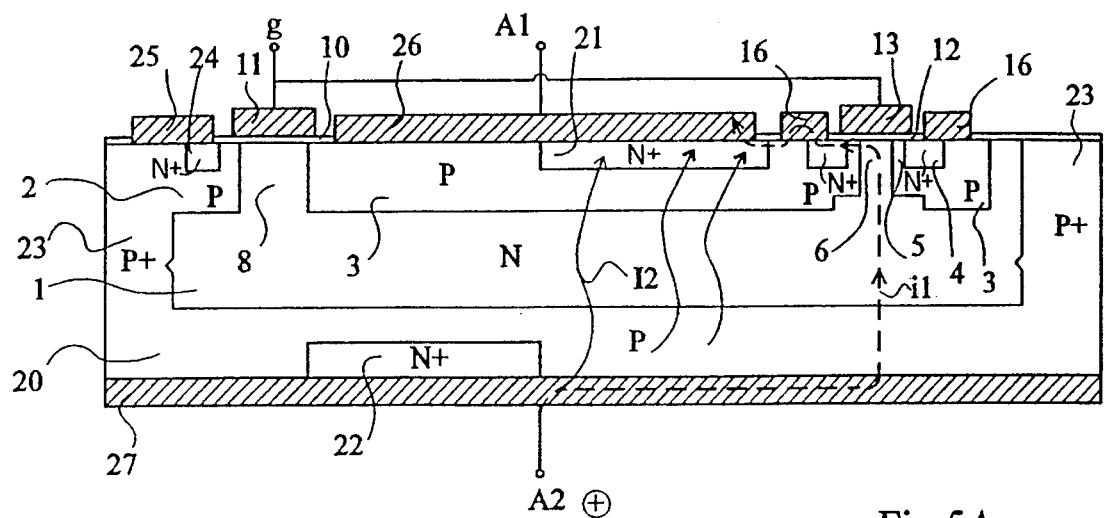
FIGS. 5A and 5B are cross-sectional views of a monolithic combination of a component according to the invention that can directly be used as a power switch, along with two polarization modes.

An embodiment of this other aspect is illustrated in FIG. 5A, where the same references as in FIG. 4A designate elements having the same functions. The component includes a substrate 1, a first P-type well 2, a second P-type well 3, an N⁺ region 4, a channel region 8, a gate insulating layer 10 and the corresponding superposed gate layer 11 for transistor tp, a channel region 5, an insulating gate layer 12 and the corresponding gate layer 13 for transistor tn. A metallization 16 connects the upper surface of region 4 to an upper adjacent surface area of well 3. The rear surface of substrate 1, instead of including an N⁺ type layer 18, includes a P-type layer 20.

The structure of FIG. 5A also differs from the structure of FIG. 4A in that the largest surface of the component is occupied by well 3 (or by a plurality of corresponding wells). Well 3 is partitioned into two areas: one area in which the well extends up to the surface of the component, and another area, having a substantially equal surface, in which an N⁺ type region 21 is formed in well 3. On the rear surface of the component, in region 20, an N⁺-type region 22 substantially complements, in projection, region 21 with respect to the surface of well 3. In addition, a P-type deep diffused region 23 connects well 2 on the upper surface of the component to region 20 on the lower surface of the component. As illustrated in FIG. 5A, the deep diffused region 23 preferably is peripherally disposed and simultaneously insulates the component in the same way as well-type thyristors. Then, an N-type region 24 is formed in the P-type well 2, close to the channel region 8. Region 24 is connected through a metallization 25 to the upper surface of the deep diffused region 23.

As above, gates 11 and 13 are connected to a terminal g. In this case, metallization 16 and metallization 25 float, and the upper surface of well 3 as well as the upper surface of the N⁺-type region 21 are coated with a conductive layer 26 that is connected to a terminal A1. The rear surface metallization 27 (instead of floating as in the case of FIG. 4A) is connected to terminal A2.

The operation of the voltage-controlled device will now be explained with reference to two possible polarization modes of terminal A2 with respect to terminal A1. As above, it is assumed that terminal A1 is grounded and that terminal A2 is either positive or negative with respect to terminal A1. If no voltage is applied on terminal g, (i.e., terminal g is maintained floating), if terminal A2 is positive with respect to terminal A1, the PN junction between well 3 and substrate 1 blocks the reverse voltage; and if terminal A2 is negative with respect to terminal A1, the PN junction between layer 20 and substrate 1 blocks the voltage.

FIG. 5A illustrates the switching-on mode of the component when terminal A2 is positive with respect to terminal A1. In this case, since the component is initially blocked, the application on the control terminal g of a voltage positive with respect to terminal A1 causes a channel to be formed in region 5. A current i1 flows from terminal A2 of metallization 27, through the P-type region 20, substrate 1, region 6 of substrate 1, channel 5, region 4, metallization 16, a portion of well 3, and region 21 toward terminal A1. The current flowing from metallization 16 toward the N⁺ region 21 behaves like a gate current for the PNPN thyristor including layers 20, 1, 3 and 21; thus, the PNPN thyristor triggers and causes a current 12 to flow with a very low voltage drop between its terminals. Region 21 (as well as region 22) can include emitter shorts, that is, regions 21 and 22 are interrupted so that portions of well 3 appear at the surface in the interrupted areas. The PNPN thyristor gets blocked when the voltage across its terminals is reversed (or more precisely as soon as the current 12 flowing therethrough is lower than its hold current IH).

Figure 5B:
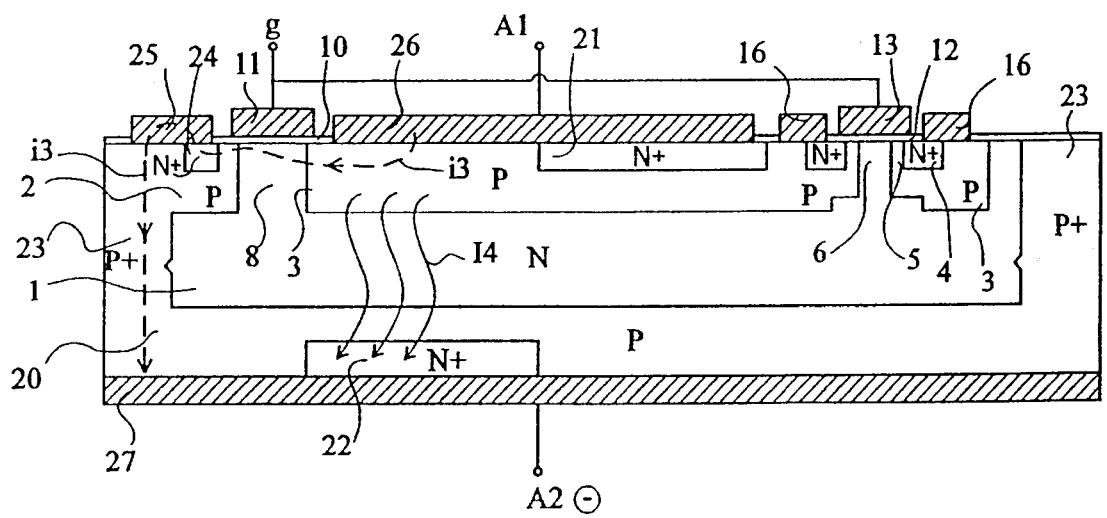

FIG. 5B illustrates the case when terminal A2 is negative with respect to terminal A1. Gate g is negatively biased with respect to terminal A1 to cause the switching on. Then, a channel is formed in the N-type substrate region 8 beneath gate 11 and the transistor corresponding to the P-channel MOS transistor tp of FIG. 4C becomes conductive. A current $i_3$ flows from terminal A1 in well 3, channel 8, a portion of well 2, region 24, metallization 25, the deep diffused region 23, toward layer 20 and terminal A2. Current $i_3$ corresponds to the switching on of a lateral PNPN thyristor formed by regions 3, 8, 2, 24, which causes the conduction of a main vertical thyristor including regions 3, 1, 20 and 22, and a current 14 flows between terminals A2 and A1. The PNPN thyristor is blocked when the voltage between its terminals is inverted (as soon as current 12 flowing therethrough gets lower than its hold current IH).

Figure 5C:
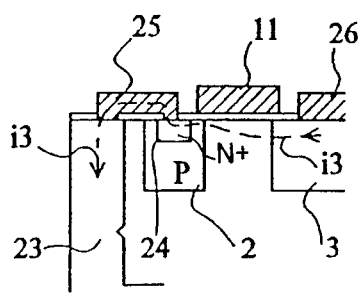
FIG. 5C is a cross-sectional view of an alternative embodiment of a portion of the component of FIGS. 5A and 5B.

FIG. 5C illustrates an alternative embodiment of the upper left portion of the component of FIG. 5A. In this alternative embodiment, well 2 does not contact deep diffused region 23, whereas metallization 25 still connects the upper surface of regions 23 and 24.

As is apparent to those skilled in the art, particularly in the fabrication of thyristors and triacs, various modifications can be made to the above disclosed preferred embodiments. More particularly, the doping levels and the sizes of the various layers are not indicated because, for the embodiment of FIG. 4A and 4B, they correspond to those conventionally used for the fabrication of vertical MOS transistors and, for the embodiment of FIGS. 5A and 5B, they correspond to those conventionally used for the fabrication of thyristors and triacs. All the conventional alternative embodiments used for these various components can also be incorporated in the device according to the invention.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A device including, in a semiconductor substrate of a first conductivity type:
   a lateral MOS transistor of a second conductivity type;
   a vertical MOS transistor of the first conductivity type including a source well;
   the source well of the vertical MOS transistor connected to a source of the lateral MOS transistor;
   a first main terminal for receiving a first input voltage coupled to the source of the lateral MOS transistor and the source well of the vertical MOS transistor;
   a second main terminal for receiving a second input voltage coupled to a drain of the lateral MOS transistor; and
   a control terminal coupled to a gate of the lateral MOS transistor and a gate of the vertical MOS transistor;
   wherein current flows from one of the first and second main terminals to the other of the first and second main terminals in response to relative voltage levels at the first and second main terminals and at the control terminal.

2. The device of claim 1, wherein a rear surface of the semiconductor substrate includes a highly doped region of the first conductivity type having a surface coated with a metallization.

3. The device of claim 1, further including a first thyristor having a gate electrode coupled to one of the first and second main terminals.

4. The device of claim 3, further including a second thyristor having a gate electrode coupled to the other of the first and second main terminals.

5. The device of claim 1, further including first and second diodes, the first diode being disposed between the source well and a drain of the vertical MOS transistor, the second diode being disposed between the drain of the vertical MOS transistor and the second main terminal, each of the first and second diodes having an anode coupled to a respective main terminal and cathodes that are coupled together.

6. The device of claim 1, wherein:
   the lateral MOS transistor comprises a first well of the second conductivity type, and a second well of the second conductivity type, each formed in an upper surface of the substrate, and a first channel defined by the substrate between the first well and the second well.

7. The switch of claim 6, wherein:
   the vertical MOS transistor comprises the second well, a highly doped region of the first conductivity type formed in the second well, the highly doped region extending along at least one edge of the second well to define a second channel region with the edge of the second well.

8. A voltage-controlled monolithic bidirectional switch having first and second main terminals and including a control electrode having a voltage referenced with respect to one of said main terminals, the switch comprising:
   a substrate of a first conductivity type having an upper and a lower surface;
   a first well and a second well of a second conductivity type formed in the upper surface, the substrate between the first and second wells defining a first channel;
   a first region, of the first conductivity type, formed in the second well and extending along a portion of a periphery of the second well thereby defining a second channel;
   a second region of the first conductivity type formed in the second well;
   a layer of the second conductivity type formed in the lower surface of the substrate;
   a third region of the first conductivity type formed in the layer;
   a deep diffused region of the second conductivity type extending from the first well on the upper surface to the layer;
   a fourth region of the first conductivity type, formed in the first well;
   a first metallization connecting the first region to the second well;
   a second metallization connecting the fourth region to the deep diffused region;
   a third metallization formed over the second well and the second region, wherein the first main terminal is coupled to the third metallization;
   a fourth metallization formed over the rear surface, wherein the second main terminal is coupled to the fourth metallization;
   a first insulated gate formed over the first channel; and
   a second insulated gate formed over the second channel, wherein the control electrode is coupled to the first and second insulated gates.

9. The switch of claim 8, wherein the deep diffused region is formed at a periphery of the semiconductor substrate.

10. The switch of claim 8, wherein the region corresponding to the second channel is less highly doped than a remaining portion of the second well.

11. The switch of claim 8, wherein the first well is adjacent the deep diffused region.

12. The switch of claim 8, wherein the third region is substantially aligned perpendicularly with respect to the upper surface with a portion of the second well that does not include the second region, so that the third region, the layer, the substrate, and the second well form a first thyristor, and so that the layer, the substrate, the second well, and the second region form a second thyristor.

13. The switch of claim 8, wherein:

the second region of the first conductivity type formed in the second well occupies substantially one half of a surface of the second well.

14. The switch of claim 8, wherein:

the third region of the first conductivity type formed in the layer substantially faces a portion of the second well so as to complement the second region.

15. The switch of claim 8, wherein:

the second well is partitioned into a first area in which the second well extends up to the upper surface of the substrate and a second area having a substantially equal surface to that of the first area, the second area consisting of the second region of the first conductivity type.

16. The switch of claim 15, wherein:

the third region is substantially aligned, perpendicularly with respect to the upper surface, with the first area of the second well.

17. The switch of claim 8, wherein:

the third region is substantially aligned, perpendicularly with respect to the upper surface, with a portion of the second well which does not include the second region.

18. A voltage-controlled monolithic bidirectional switch having first and second main terminals and including a control electrode having a voltage referenced with respect to one of said main terminals, the switch comprising:

a substrate of a first conductivity type having an upper surface;

a first well and a second well of a second conductivity type formed in the upper surface, a first channel being defined by the substrate between the first and second wells;

a first region of the first conductivity type formed within a periphery of the second well to define a second channel;

a first insulated gate formed over the first channel;

a second insulated gate formed over the second channel;

the control electrode connected to the first insulated gate and the second insulated gate;

a first metallization formed over the first well and coupled to the second main terminal; and a second metallization formed over the first region and the second well and coupled to the first main terminal.

19. The switch of claim 18, further including a third metallization formed over a lower surface of the substrate, a current path being defined from the second main terminal through the first well, the substrate, the third metallization, the substrate, the second well, the first region, and to the first main terminal, the current path being activated when a voltage on the second main terminal exceeds a voltage on the first main terminal and a voltage at the control electrode exceeds the voltage on the first main terminal.

20. A voltage-controlled monolithic bidirectional switch having first and second main terminals and including a control electrode having a voltage referenced with respect to one of the first and second main terminals, the switch comprising:

a substrate of a first conductivity type having an upper and a lower surface;

a lateral P-channel MOS transistor including a source, drain and channel disposed in the substrate;

a vertical N-channel MOS transistor including a source well disposed in the substrate;

the source well of the vertical transistor connected to the source of the lateral transistor;

a lateral thyristor disposed in the substrate, the lateral thyristor including the source, the drain the channel of the lateral transistor and a first region formed in the drain;

a first vertical thyristor disposed in the substrate, the first vertical thyristor having a first polarity, the first vertical thyristor including the source of the lateral transistor, and second, third and fourth regions, the source region of the lateral transistor defining a first end of the first vertical thyristor and the fourth region defining a second end of the first vertical thyristor;

a second vertical thyristor disposed in the substrate, the second vertical thyristor having a second polarity opposite the first polarity of the first vertical thyristor, the second vertical thyristor disposed in parallel with the first vertical thyristor and including the source region of the lateral transistor, the second and third regions of the first vertical thyristor and a fifth region corresponding to the source well of the vertical N-channel MOS transistor, the fifth region defining a first end of the second vertical thyristor and the third region defining a second end of the second vertical thyristor;

the control electrode coupled to the channel of the lateral transistor and the channel of the vertical transistor;

the first main terminal coupled to the first end of the first vertical thyristor, the first end of the second vertical thyristor, the source of the lateral transistor and the source well of the vertical transistor; and the second main terminal coupled to the second end of the first vertical thyristor and the second end of the second vertical thyristor.

* * * * *